United States Patent
Hattori et al.

(10) Patent No.: US 10,320,172 B2
(45) Date of Patent: Jun. 11, 2019

(54) ELECTRIC WIRE LEAD-IN PART STRUCTURE OF ELECTRIC COMPRESSOR, AND ELECTRIC COMPRESSOR AND SHIELD ELECTRIC WIRE PROVIDED WITH SAME

(71) Applicant: MITSUBISHI HEAVY INDUSTRIES THERMAL SYSTEMS, LTD., Tokyo (JP)

(72) Inventors: Makoto Hattori, Tokyo (JP); Hiroyuki Kamitani, Tokyo (JP); Hiroto Higuchi, Tokyo (JP); Takayuki Takashige, Tokyo (JP); Takeo Hayashi, Aichi (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 0 days.

(21) Appl. No.: 16/079,518

(22) PCT Filed: Jun. 19, 2017

(86) PCT No.: PCT/JP2017/022455
§ 371 (c)(1),
(2) Date: Aug. 23, 2018

(87) PCT Pub. No.: WO2017/221864
PCT Pub. Date: Dec. 28, 2017

(65) Prior Publication Data
US 2019/0052070 A1 Feb. 14, 2019

(30) Foreign Application Priority Data
Jun. 24, 2016 (JP) .................................. 2016-125429

(51) Int. Cl.
*H05K 9/00* (2006.01)
*H02G 3/22* (2006.01)
(Continued)

(52) U.S. Cl.
CPC ............ *H02G 3/22* (2013.01); *B60R 16/0215* (2013.01); *F04B 35/04* (2013.01); *F04B 39/121* (2013.01);
(Continued)

(58) Field of Classification Search
CPC . B60R 16/0215; H05K 9/0098; H05K 9/0018
See application file for complete search history.

(56) References Cited

U.S. PATENT DOCUMENTS 9,161,482 B2 * 10/2015 Adachi ................ H01R 13/648
9,192,081 B2 * 11/2015 Adachi ................ H02G 3/0487
(Continued)

FOREIGN PATENT DOCUMENTS

| JP | 2003-115357 A | 4/2003 |
| JP | 2004-152548 A | 5/2004 |

(Continued)

OTHER PUBLICATIONS

International Search Report dated Aug. 29, 2017 for International Patent Application No. PCT/JP2017/022455 with an English Translation.

(Continued)

*Primary Examiner* — Hung V Ngo
(74) *Attorney, Agent, or Firm* — Birch, Stewart, Kolasch & Birch, LLP

(57) ABSTRACT

An electric wire lead-in part structure (15) includes: a conductor insertion hole (16) formed through a wall part (2Ca) of an inverter accommodating chamber; a conductor member (17) made of an electrically conductive material and inserted into the conductor insertion hole (16) in a waterproof manner and also, electrically conducted to the conductor insertion hole (16) and holding a power supply cable (11) passed therethrough; a shield grounding part (50) for electrically conducting a shield part (45) of the power (Continued)

supply cable (11) to the conductor member (17) at a position where the conductor member (17) is provided; and an electric wire waterproofing part (40) for waterproofing a gap between the conductor member (17) and the power supply cable (11). The shield grounding part (50) is configured to fasten a set screw (52) abutted against a crimp ring (55) provided on the shield part (45), the set screw (52) being threadedly engaged with the conductor member (17) so as to protrude into an electric wire passing hole (23) formed in the conductor member (17), across the axial direction of the electric wire passing hole (23).

6 Claims, 6 Drawing Sheets

(51) Int. Cl.
    *H01B 9/02*     (2006.01)
    *H01R 4/30*     (2006.01)
    *F04B 39/12*     (2006.01)
    *F04B 35/04*     (2006.01)
    *B60R 16/02*     (2006.01)
    *F04B 37/12*     (2006.01)
    *H01R 11/12*     (2006.01)

(52) U.S. Cl.
    CPC ............. *H01B 9/028* (2013.01); *H01R 4/308* (2013.01); *H05K 9/0018* (2013.01); *H05K 9/0098* (2013.01); *F04B 37/12* (2013.01); *H01R 11/12* (2013.01)

(56) References Cited

U.S. PATENT DOCUMENTS

| | | | | |
|---|---|---|---|---|
| 9,676,349 | B2* | 6/2017 | Kanagawa | H02G 3/0462 |
| 9,793,694 | B2* | 10/2017 | Sugino | B60R 16/0215 |
| 2008/0164059 | A1* | 7/2008 | Cipolla | H02G 3/22 |
| | | | | 174/360 |
| 2009/0126985 | A1* | 5/2009 | Aoki | H02G 3/0683 |
| | | | | 174/377 |
| 2014/0295703 | A1* | 10/2014 | Nagashima | H02J 5/005 |
| | | | | 439/607.01 |
| 2015/0289420 | A1* | 10/2015 | Imahori | H01F 17/06 |
| | | | | 174/350 |
| 2016/0100509 | A1* | 4/2016 | Yanagihara | H01R 9/034 |
| | | | | 174/350 |
| 2016/0134093 | A1* | 5/2016 | Albert | H01R 9/0518 |
| | | | | 174/360 |
| 2016/0240982 | A1* | 8/2016 | Ohkubo | H01R 9/032 |
| 2016/0295755 | A1* | 10/2016 | Lee | H02G 3/0481 |
| 2017/0273205 | A1* | 9/2017 | Hanft | H05K 5/0069 |

FOREIGN PATENT DOCUMENTS

| | | |
|---|---|---|
| JP | 2011-236858 A | 11/2011 |
| JP | 2015-207399 A | 11/2015 |

OTHER PUBLICATIONS

Written Opinion dated Aug. 29, 2017 for International Patent Application No. PCT/JP2017/022455 with an English Translation.

* cited by examiner

ELECTRIC WIRE LEAD-IN PART STRUCTURE OF ELECTRIC COMPRESSOR, AND ELECTRIC COMPRESSOR AND SHIELD ELECTRIC WIRE PROVIDED WITH SAME

TECHNICAL FIELD

The present invention relates to an electric wire lead-in part structure of an electric compressor applied to such a part that a shield electric wire such as a power supply cable is led into a housing, and to a shield electric wire and electric compressor provided with the same.

BACKGROUND ART

An electric compressor used in a vehicle air conditioner has a light alloy-made housing that accommodates a refrigerant compressing mechanism, an electric motor for driving the mechanism, and an inverter device for controlling the electric motor. In the housing, an inverter accommodating chamber partitioned from a refrigerant circulating part is formed to accommodate the inverter device.

At a wall part of the inverter accommodating chamber, an electric wire lead-in part for leading a power supply cable to the inverter device is provided. As the power supply cable, a shield electric wire is used in order to reduce noise superimposition caused by a high voltage. The shield electric wire has such a structure that a core wire is covered with a first insulating layer, the outer circumference of the first insulating layer is covered with a metal mesh-like shield part, and also, the circumference of the shield part is covered with a second insulating layer. Aside from a terminal portion to which the core wire is connected, the shield part has to be connected to the housing, etc. of the electric compressor and securely grounded.

To give an example of a connecting part structure of such a shield electric wire, a grounding structure of an electric compressor is disclosed in Patent Document 1. In this disclosure, a core wire of a power supply cable, which is a shield wire, is fastened to a terminal of a circuit substrate by use of a screw member and also, an end portion of an electrically conductive shield member (shield part) led like a single wire from around an end portion of the power supply cable is fastened together with the circuit substrate to an installation portion (ground point) in an inverter accommodating part by use of a screw member to thereby enable case grounding to the housing.

CITATION LIST

Patent Document

Patent Document 1: Japanese Unexamined Patent Application Publication No. 2011-236858 A

SUMMARY OF INVENTION

Technical Problem

In the connecting part structure of the shield electric wire disclosed in Patent Document 1, however, the shield part is led like a single wire from around the end portion of the power supply cable and fastened to the ground point and thus, the shield part with such a single wire portion may possibly generate noise. As such, a satisfactory noise reduction effect cannot be expected.

Also, since a space for fastening the shield part to the ground point is required in addition to a space for fastening the core wire of the power supply cable, a space around the terminal portion is occupied, leading to a problem that compactness of the circuit substrate is impaired.

Furthermore, depending on the position of the ground point, workability upon fastening the shield part may possibly be lowered.

The present invention has been made with a view to solving the above problems, and an object of the invention is to provide an electric wire lead-in part structure of an electric compressor which enables a high noise reduction effect of a shield electric wire, size reduction, and satisfactory workability upon fastening a shield part, and a shield electric wire and electric compressor provided with the same.

Solution to Problem

In order to achieve the above object, the present invention adopts the following.

Specifically, a first aspect of the present invention provides an electric wire lead-in part structure of an electric compressor which is configured to lead a shield electric wire such as a power supply cable into an inverter accommodating chamber of the electric compressor, including: a conductor insertion hole formed through a wall part of the inverter accommodating chamber; a conductor member made of an electrically conductive material and inserted into the conductor insertion hole in a waterproof manner and also, electrically conducted to the conductor insertion hole and holding the shield electric wire passed therethrough; and a shield grounding part for electrically conducting a shield part of the shield electric wire to the conductor member at a position where the conductor member is provided; and an electric wire waterproofing part for waterproofing a gap between the conductor member and the shield electric wire.

According to the above electric wire lead-in part structure of an electric compressor, the conductor member is inserted into the conductor insertion hole formed through the wall part of the inverter accommodating chamber to thereby electrically conduct and waterproof a gap between the conductor member made of an electrically conductive material and the wall part (conductor insertion hole) of the inverter accommodating chamber. Moreover, the shield part of the shield electric wire that runs through the conductor member is electrically conducted to the conductor member via the shield grounding part and also, the shield electric wire is waterproofed with respect to the conductor member via the electric wire waterproofing part.

The shield part of the shield electric wire is electrically conducted to the conductor member at the shield grounding part and electrically grounded to a housing of the electric compressor via the conductor member. Hence, it is unnecessary to follow a conventional process, i.e., leading out the shield part from around an end portion of the shield electric wire like a single wire and fastening the shielding part to the ground point, whereby a noise reduction effect can be enhanced. Furthermore, it is unnecessary to provide an additional ground point for the shield part in a circuit substrate, etc. Accordingly, the circuit substrate and the structure around a connecting part of the shield electric wire can be downsized.

In the above electric wire lead-in part structure, the shield grounding part can be configured to fasten a set screw abutted against the shield part, the set screw being threadedly engaged with the conductor member so as to protrude into an electric wire passing hole formed in the conductor member, across an axial direction of the electric wire passing hole.

According to this structure, since the shield part is secured to the conductor member by means of the set screw with no head, it is possible to downsize the shield grounding part within the dimensions in the axial and radial directions of the conductor member and in turn, to downsize the conductor member and consequently downsize the electric wire lead-in part.

The shield part can be secured by the set screw before the insertion of the conductor member into the conductor insertion hole. Hence, high workability upon fastening the shield part is realized.

In the above electric wire lead-in part structure, a crimp ring that is electrically conducted to the shield part, can be fit around the shield electric wire at midpoint thereof, and the set screw can be brought into abutment with the shield part via the crimp ring.

With the above structure, the inner circumference of the crimp ring comes into close contact with the outer circumference of a metal mesh-like shield part, whereby the crimp ring and the shield part are almost in surface contact with each other to thereby ensure electrical conduction therebetween.

Furthermore, since the set screw comes into close contact with the outer circumferential surface of the crimp ring, electrical conduction is also ensured between the crimp ring and the set screw.

Accordingly, a satisfactory grounding route is established in the order of the shield part, the crimp ring, the set screw, the conductor member, and the inverter accommodating chamber (housing of the electric compressor) to thereby reliably ground the shield part and enhance a noise reduction effect.

Since the fastening force of the set screw is mainly applied to the outer circumferential surface of the crimp ring and the crimp ring has predetermined strength, the fastening force of the set screw is not so much applied to the shield electric wire in the crimp ring. This makes it possible to protect the shield electric wire against any damage caused by the fastening force of the set screw.

The above electric wire lead-in part structure can further include: a covering member configured to cover the conductor insertion hole and outside of the conductor member; and a joint part configured to fasten the conductor member and the covering member together to the wall part, the electric wire waterproofing part including: an inner end surface of the covering member; a cylindrical hole-like sealing member engagement recess formed in the conductor member adjoining outside in an axial direction of the electric wire passing hole, and closed by the inner end surface of the covering member; and a sealing member that is formed of an elastic material into a short cylindrical shape, that has a larger size in thickness than an axial depth of the sealing member engagement recess, that is fit into the sealing member engagement recess, and that allows the shield electric wire to pass therethrough.

According to the above structure, the covering member covers the outside of the conductor member, and when these members are fastened together to the wall part by means of the joint part, the sealing member formed of an elastic material into a short cylindrical shape is compressed by the inner end surface of the covering member in the axial direction inside the sealing member engagement recess formed in the conductor member, and the sealing member is expanded radially inwards and outwards.

Hence, the outer circumferential surface of the shield electric wire that runs through the sealing member is pressed by the sealing member and also, the outer circumferential surface of the sealing member and the inner circumferential surface of the sealing member engagement recess come into close contact to thereby reliably waterproof a gap between the conductor member and the shield electric wire.

A second aspect of the present invention provides a shield electric wire including the above electric wire lead-in part structure. This ensures electrical conduction of the shield part of the shield electric wire to the wall part of the inverter accommodating chamber via the shield grounding part and the conductor member to thereby reduce noise.

A third aspect of the present invention provides an electric compressor including the above electric wire lead-in part structure. This realizes the aforementioned operations and effects.

Advantageous Effects of Invention

As mentioned above, according to the present invention, it is possible to provide an electric wire lead-in part structure of an electric compressor which enables a high noise reduction effect of a shield electric wire, size reduction, and satisfactory workability upon fastening a shield part, and a shield electric wire and electric compressor provided with the same.

DESCRIPTION OF EMBODIMENTS

Hereinafter, embodiments of the present invention are described with reference to the accompanying drawings.

Figure 1:
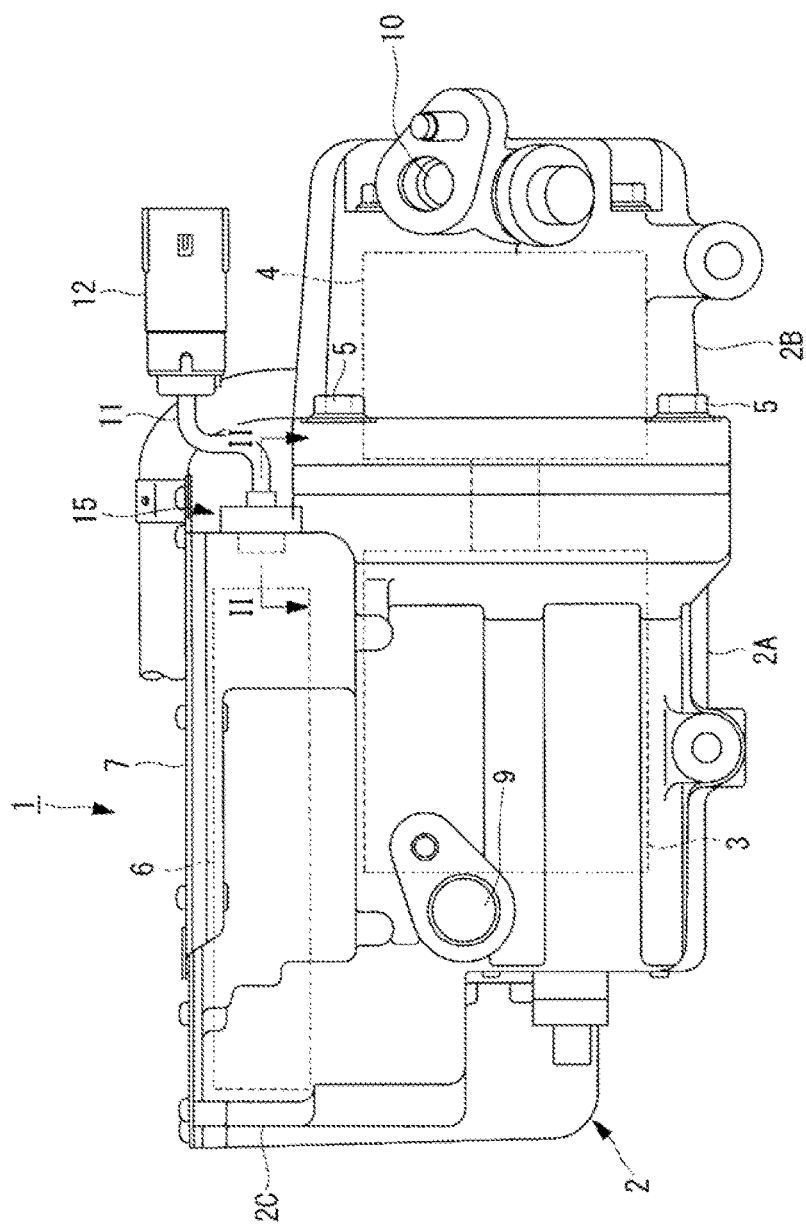
FIG. 1 is a side view of an example of an electric compressor that can incorporate an electric wire lead-in part structure and shield electric wire according to the present invention.

FIG. 1 is a side view of an example of an electric compressor that can incorporate an electric wire lead-in part structure and shield electric wire according to the present invention. An electric compressor 1 includes a housing 2 made of an aluminum alloy. The housing 2 includes an electric motor side housing 2A for accommodating an electric motor 3 and a compressing mechanism side housing 2B for accommodating a compressing mechanism 4, which are securely fastened by plural bolts 5. Also, an inverter accommodating chamber 2C for accommodating an inverter 6 is integrally formed above the electric motor side housing 2A.

The inverter accommodating chamber 2C is open on its upper side, for example, and the open portion is closed by a cover 7.

The compressing mechanism 4 is driven by the electric motor 3 to take in a gas refrigerant from a refrigerant suction part 9 and then compress and discharge the refrigerant from a refrigerant discharge part 10. The electric motor 3 is controlled by the inverter 6. A power supply cable 11 for supplying power to the inverter 6 is led into the inverter accommodating chamber 2C from the outside, and an electric wire lead-in part structure 15 of the present invention is applied thereto. At a free end of the power supply cable 11, a connector 12 is provided. Since a high voltage of about 300 V is applied through the power supply cable 11, a shield electric wire is used to suppress noise superimposition.

Figure 2:
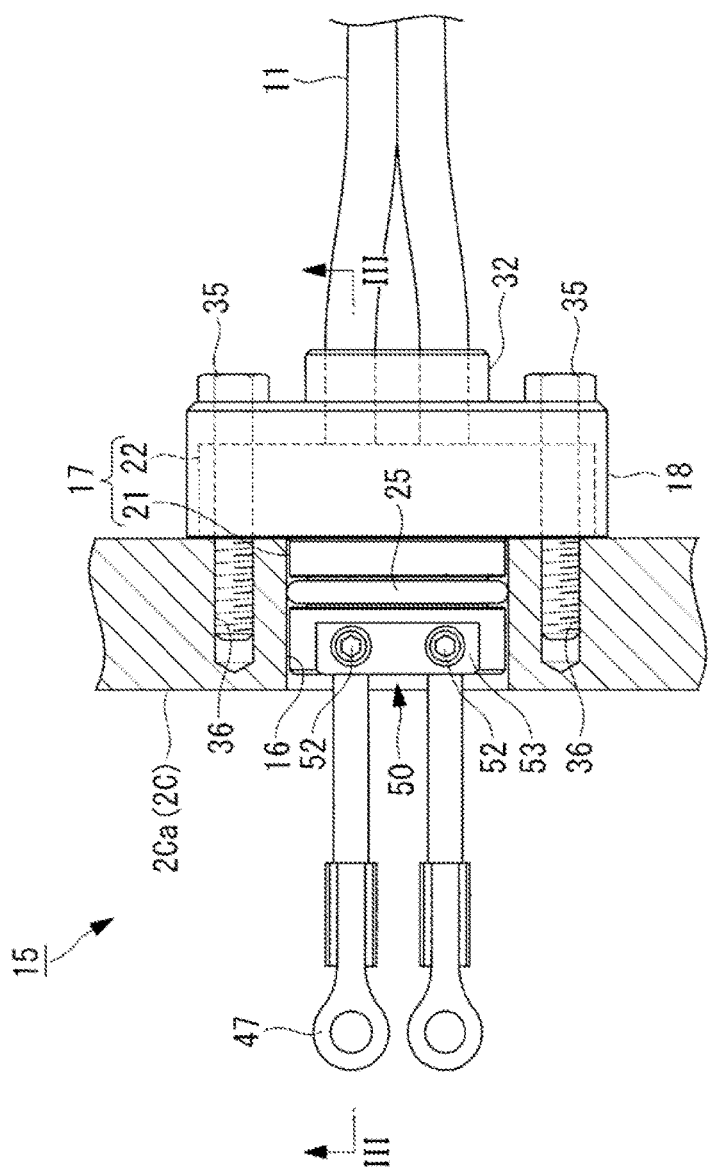
FIG. 2 is a cross-sectional view of the electric wire lead-in part structure and power supply cable taken along line II-II of FIG. 1.
Figure 3:
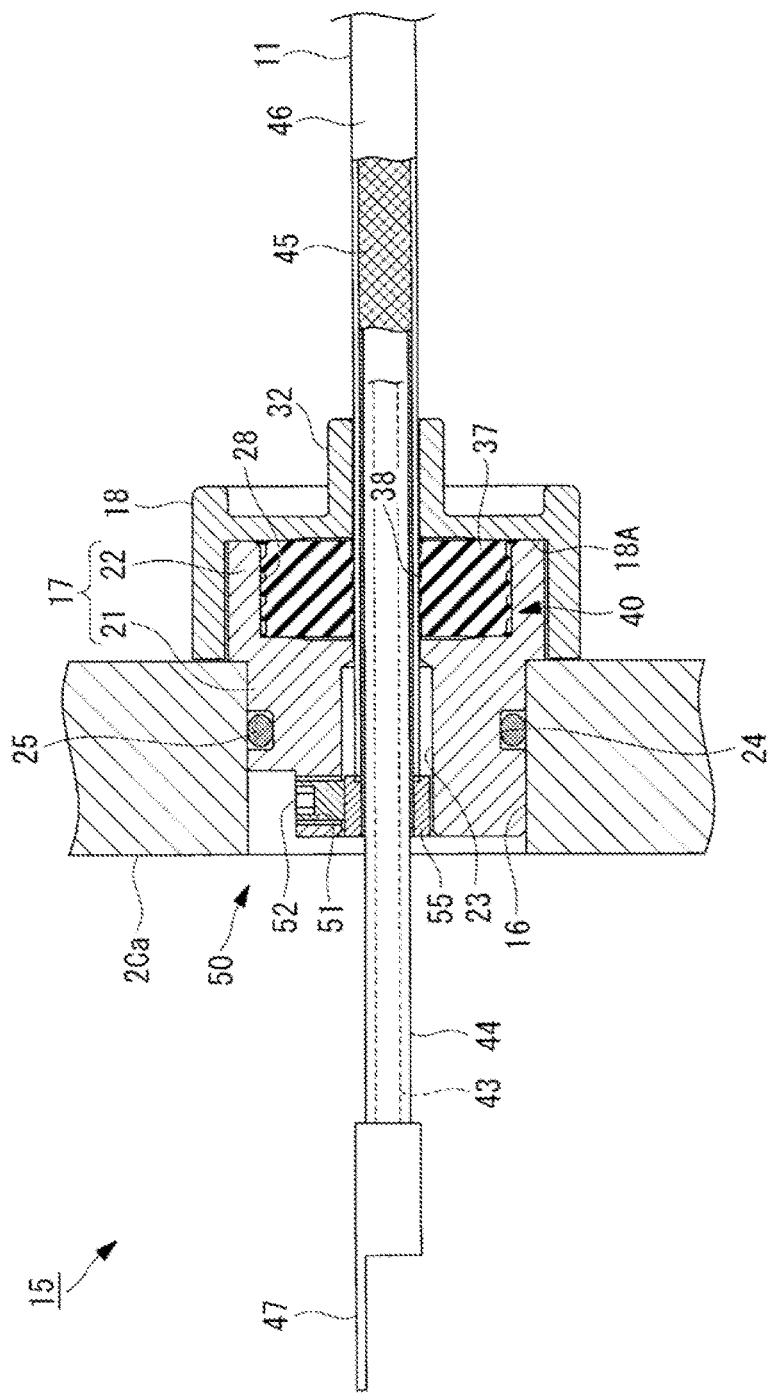
FIG. 3 is a longitudinal sectional view of the electric wire lead-in part structure and power supply cable taken along line of FIG. 2.
Figure 4:
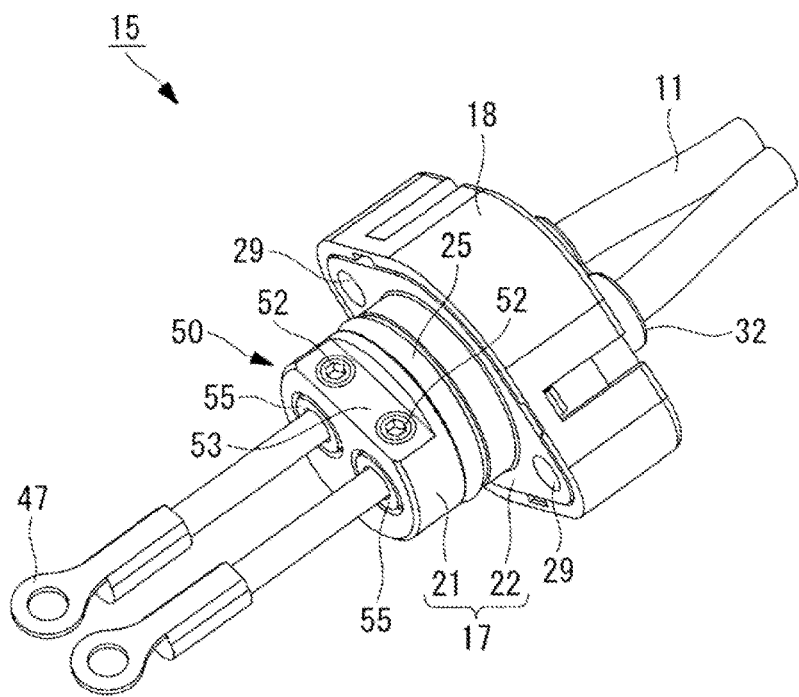
FIG. 4 is a perspective view of an assembly of the electric wire lead-in part structure and power supply cable as viewed from the inside of an inverter accommodating chamber.
Figure 5:
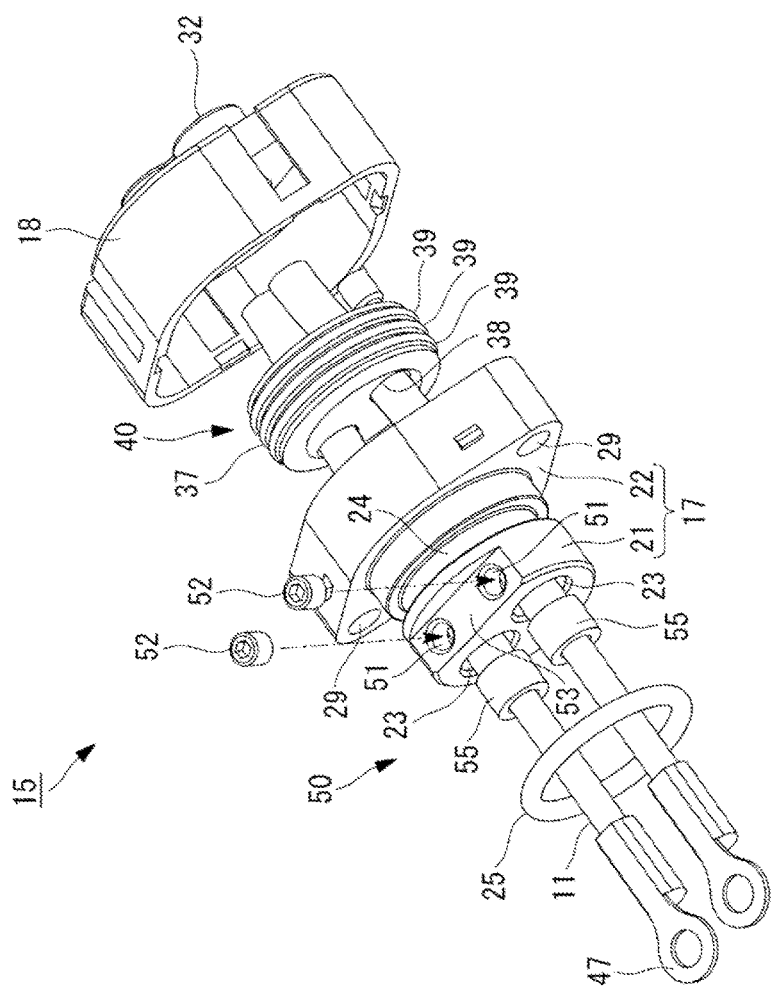
FIG. 5 is an exploded perspective view of the electric wire lead-in part structure and power supply cable as viewed from the inside of the inverter accommodating chamber.
Figure 6:
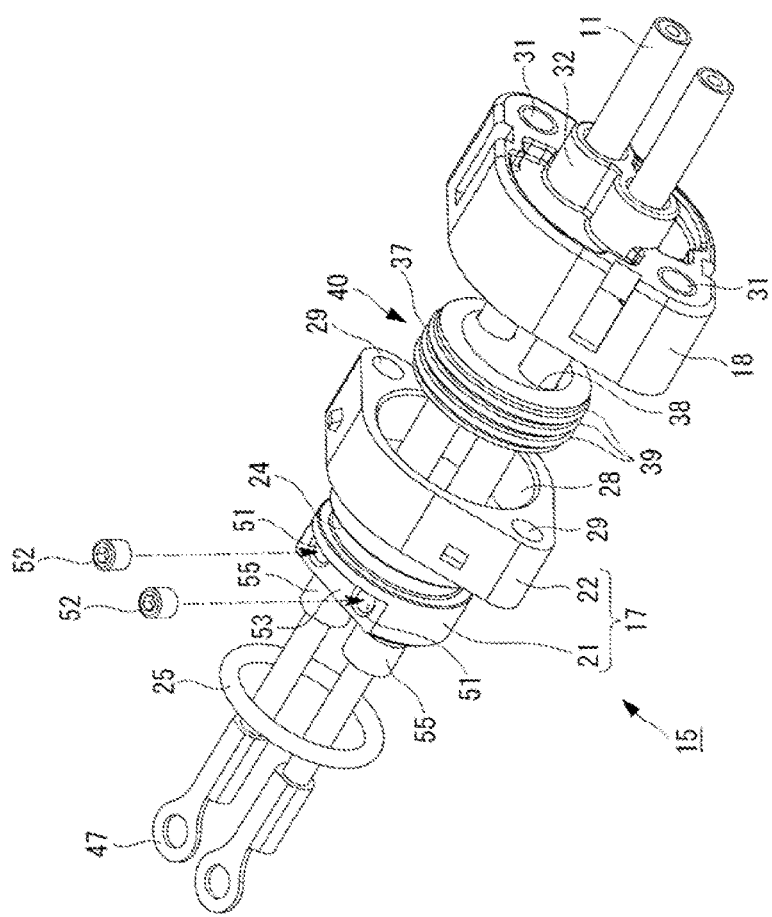
FIG. 6 is an exploded perspective view of the electric wire lead-in part structure and power supply cable as viewed from the outside of the inverter accommodating chamber.

FIG. 2 is a cross-sectional view of the electric wire lead-in part structure 15 taken along line II-II of FIG. 1, and FIG. 3 is a longitudinal sectional view of the electric wire lead-in part structure 15 taken along line of FIG. 1. FIGS. 4, 5, and 6 are perspective views of the electric wire lead-in part structure 15.

The electric wire lead-in part structure 15 has a conductor insertion hole 16 (see FIG. 3) formed through a wall part 2Ca of the inverter accommodating chamber 2C, a conductor member 17 to be inserted into the conductor insertion hole 16, which is made of an electrically conductive material such as aluminum, copper, or brass, and a covering member 18 for covering the outside of the conductor member 17 and the conductor insertion hole 16, which is made of an insulating material such as resin.

The conductor member 17 has an insertion part 21 of almost a cylindrical shape and a plate-like fixed flange part 22 of a predetermined thickness, which is continuous to one end thereof. The insertion part and the flange part are integrally formed. Inside the insertion part 21, two electric wire passing holes 23 are perforated in parallel along an axial direction (insertion direction). The power supply cable 11 is inserted into each of the two electric wire passing holes 23. Specifically, the conductor member 17 is a member that holds the two power supply cables 11 inserted therein. Also, an O ring 25 (see FIGS. 3, 5, and 6) is fit in a groove 24 formed in the outer circumferential surface of the insertion part 21.

The insertion part 21 of the conductor member 17 is inserted to the conductor insertion hole 16 until the fixed flange part 22 abuts the wall part 2Ca. At this time, the O ring 25 comes into close contact with the inner circumferential surface of the conductor insertion hole 16 to thereby waterproof a gap between the conductor insertion hole 16 and the conductor member 17. Moreover, when the fixed flange part 22 is brought into contact with the wall part 2Ca and secured by a bolt as described later, the conductor member 17 made of an electrically conductive material is electrically conducted to the conductor insertion hole 16 (housing 2).

As illustrated in FIG. 2 and FIGS. 4 to 6, the fixed flange part 22 of the conductor member 17 has a larger diameter than the insertion part 21. The fixed flange part is wider, for example, in the horizontal direction. As illustrated in FIGS. 3 and 6, the fixed flange part 22 has a sealing member engagement recess 28 of a cylindrical hole shape, which is recessed from the outer end surface thereof. This sealing member engagement recess 28 communicates with the electric wire passing hole 23. Also, a pair of bolt insertion holes 29 (joint part) are formed on both sides of the sealing member engagement recess 28 (see FIGS. 4 to 6).

As described above, the covering member 18 is formed of an insulating material such as resin. As illustrated in the drawings, it has substantially a cap-like shape so as to cover the fixed flange part 22 of the conductor member 17. Also, it has a pair of bolt holes 31 (joint part: see FIG. 6) corresponding to the bolt insertion holes 29 of the conductor member 17 (fixed flange part 22) and two electric wire insertion tubes 32 corresponding to the electric wire passing holes 23 of the conductor member 17 (insertion part 21).

The covering member 18 and the conductor member 17 are fastened together to the wall part 2Ca of the inverter accommodating chamber by use of a screw member 35 (joint part) such as a bolt. The screw member 35 is fastened to a female screw 36 (joint part) formed in the wall part 2Ca through the bolt hole 31 of the covering member 18 and the bolt insertion hole 29 of the conductor member 17. When the conductor member 17 and the covering member 18 are fastened together to the wall part 2Ca, the sealing member engagement recess 28 formed in the conductor member 17 (fixed flange part 22) is closed by an inner end surface 18A of the covering member 18.

A sealing member 37 is fit into the sealing member engagement recess 28. This sealing member 37 is formed of an elastic material such as rubber or soft resin (e.g., silicon) into a short cylindrical shape, and has two cable passing holes 38 (see FIGS. 3, 5, and 6) through which the two power supply cables 11 are inserted. Also, plural protruding ribs 39 that extend in the circumferential direction are formed on the outer circumferential surface of the sealing member 37 and the inner circumferential surface of the cable passing hole 38 (see FIGS. 5 and 6).

The sealing member 37 in an unpressed, free state has a larger size in thickness than an axial depth of the sealing member engagement recess 28. The outer diameter thereof is set to allow easy insertion into the sealing member engagement recess 28, and the inner diameter of the cable passing hole 38 is set to allow smooth insertion of the power supply cable 11. The inner end surface 18A of the covering member 18, the sealing member engagement recess 28 of the conductor member 17, and the sealing member 37 constitute an electric wire waterproofing part 40 for waterproofing a gap between the conductor member 17 and the power supply cable 11.

As illustrated in FIG. 3, the power supply cable 11 as a shield electric wire is of a well-known structure: the outer circumference of a core wire 43 is covered with a first insulating layer 44, the outer circumference of the first insulating layer 44 is covered with a metal mesh-like shield part 45, and further, the circumference of the shield part 45 is covered with a second insulating layer 46. This power supply cable 11 is inserted into the electric wire passing hole 23 and sealing member engagement recess 28 of the conductor member 17, the sealing member 37, and the electric wire insertion tube 32 of the covering member 18. A terminal 47 press-fit to the tip end of the core wire 43 is fastened by a screw member to a terminal of a circuit substrate (not illustrated) constituting the inverter 6, and power is supplied to the inverter 6 through the power supply cable 11.

This electric wire lead-in part structure 15 is provided with a shield grounding part 50 that electrically conducts the shield part 45 of the power supply cable 11 to the conductor member 17, at the position where the conductor member 17 is provided, as described below. This shield grounding part 50 roughly serves to clamp the shield part 45 of the power supply cable 11 to the conductor member 17.

First, as illustrated in FIGS. 3, 5, and 6, two female screw holes 51 are formed at the insertion part 21 of the conductor member 17. These two female screw holes 51 are formed across (at right angles) an axial direction of each electric wire passing hole 23 formed in the insertion part 21, and short set screws 52 are threadedly engaged with the respective holes. These set screws 52 are well-known screw members, which have no head unlike general screw members and are fastened by use of a hex wrench. The set screw 52 threadedly engaged with the female screw hole 51 can protrude into the electric wire passing hole 23. Note that the female screw hole 51 is formed in a step-like flat surface 53 formed by cutting the outer circumferential surface of the insertion part 21, but the female screw hole 51 can be directly formed from the outer circumferential surface of the insertion part 21 without forming the flat surface 53.

On the other hand, as illustrated in FIG. 3, the shield part 45 of the power supply cable 11 is ended at the position where the set screw 52 is provided, and a crimp ring 55 made of an electrically conductive material such as aluminum is fit around this terminal portion. Specifically, end portions of the shield part 45 are bundled by the crimp ring 55 so as not to come apart. The crimp ring 55 is electrically conducted to the shield part 45. The set screw 52 threadedly engaged with the conductor member 17 abuts the outer circumferential surface of the crimp ring 55. Thus, the set screw 52 abuts the shield part 45 via the crimp ring 55 and is fastened thereto. Through the thus-configured shield grounding part 50, the shield part 45 of the power supply cable 11 is electrically conducted to the conductor member 17 via the set screw 52.

In the electric wire lead-in part structure 15 configured as above, the conductor member 17 made of an electrically conductive material such as aluminum and the conductor insertion hole 16 formed through the wall part 2Ca of the inverter accommodating chamber are electrically conducted as a result of inserting the conductor member 17 into the conductor insertion hole 16 in the wall part 2Ca of the inverter accommodating chamber and also, a gap therebetween is waterproofed by the O ring 25. Here, a liquid gasket (sealant) can be applied instead of using the O ring 25. Moreover, concurrently with the electrical conduction of the shield part 45 of the power supply cable 11 that runs through the conductor member 17 to the conductor member 17 via the shield grounding part 50, the power supply cable 11 is waterproofed with respect to the conductor member 17 via the electric wire waterproofing part 40.

At the shield grounding part 50, the shield part 45 of the power supply cable 11 is electrically conducted to the conductor member 17, and grounded via the conductor member 17 to the housing 2 of the electric compressor. This eliminates the necessity to follow the conventional process, i.e., leading out the shield part 45 from around the end portion of the power supply cable 11 like a single wire and fastening the shield part 45 to the ground point, whereby a noise reduction effect can be enhanced. In addition, it is unnecessary to provide an additional ground point for the shield part 45 in the circuit substrate, etc. of the inverter 6. This enables downsizing the circuit substrate and the structure around the connecting part of the power supply cable 11.

As described above, the shield grounding part 50 is configured to securely clamp the set screw 52 abutted against the shield part 45 of the power supply cable 11, the set screw 52 being threadedly engaged with the conductor member 17 so as to protrude into the electric wire passing hole 23 formed in the conductor member 17, across the axial direction of the electric wire passing hole 23.

According to the above structure, since the shield part 45 is fastened to the conductor member 17 by means of the set screw 52 with no head, it is possible to downsize the shield grounding part 50 within the dimensions in the axial and radial directions of the conductor member 17 and in turn, to downsize the conductor member 17 and consequently downsize the electric wire lead-in part.

The set screw 52 can fasten the shield part 45 before the insertion of the conductor member 17 into the conductor insertion hole 16 and thus, high workability upon fastening the shield part 45 is realized.

Also, the crimp ring 55 that is electrically conducted to the shield part 45, is provided at some midpoint of the power supply cable 11 and the set screw 52 abuts the shield part 45 via the crimp ring 55. The shield part 45 has a metal mesh-like form, and its outer circumferential portion comes into close contact with the inner circumferential surface of the crimp ring 55, whereby the crimp ring 55 and the shield part 45 are almost in surface contact with each other to thereby ensure electrical conduction therebetween. Furthermore, the set screw 52 comes into close contact with the outer circumferential surface of the crimp ring 55 to thereby ensure electrical conduction between the crimp ring 55 and the set screw 52.

Accordingly, a satisfactory grounding route is established in the order of the shield part 45, the crimp ring 55, the set screw 52, the conductor member 17, and the inverter accommodating chamber 2C (housing 2) to thereby surely ground the shield part 45 and enhance a noise reduction effect.

Since the fastening force of the set screw 52 is mainly applied to the outer circumferential surface of the crimp ring 55 and the crimp ring 55 has predetermined strength, the fastening force of the set screw 52 is not so much applied to the power supply cable 11 in the crimp ring 55. This makes it possible to protect the power supply cable 11 against any damage caused by the fastening force of the set screw 52.

Because of its metal mesh-like form, the shield part 45 is likely to come apart at its end portions, but these end portions are bundled by the crimp ring 55, making it possible to prevent the shield part 45 from coming apart and to improve assembly workability upon insertion of the power supply cable 11 to the electric wire passing hole 23 of the conductor member 17.

On the other hand, the electric wire waterproofing part 40 for waterproofing a gap between the conductor member 17 and the power supply cable 11 includes the inner end surface 18A of the covering member 18 for covering the outside of the conductor member 17, the cylindrical hole-like sealing member engagement recess 28 formed in the conductor member 17 and closed by the inner end surface 18A of the covering member 18, and the sealing member 37 to be fit in the sealing member engagement recess 28, and the sealing member 37 in a free state has a larger size in thickness than the axial depth of the sealing member engagement recess 28.

According to this structure, the covering member 18 covers the outside of the conductor member 17, and when these members 17 and 18 are fastened together to the wall part 2Ca by means of the screw member 35, the sealing member 37 is compressed in the axial direction inside the sealing member engagement recess 28 formed in the conductor member 17 by the inner end surface 18A of the covering member 18, and the sealing member 37 is expanded radially inwards and outwards.

Thus, the outer circumferential surface of the power supply cable 11 that runs through the cable passing hole 38 of the sealing member 37 is pressed by the inner circumferential surface of the cable passing hole 38, and the outer circumference of the sealing member 37 and the inner circumference of the sealing member engagement recess 28 come into close contact with each other. Accordingly, a gap between the conductor member 17 and the power supply cable 11 can be reliably waterproofed by a very simple, compact structure.

As described above, in the electric wire lead-in part structure 15 of the electric compressor according to this embodiment, the shield part 45 of the power supply cable 11 as the shield electric wire is electrically conducted directly to the wall part 2Ca of the inverter accommodating chamber 2C to thereby enhance a noise reduction effect and also, the portion at which the power supply cable 11 is led into the inverter accommodating chamber 2C can be downsized and in addition, the workability upon fastening the shield part 45 can be improved.

Note that the present invention is not limited to the above embodiments and can be modified and improved in various ways. These modifications and improvements of the embodiments are also encompassed in the scope of the present invention.

For example, the form, shape, etc. of the electric compressor 1 of the above embodiment can be changed. Furthermore, the shape, layout, etc. of the respective parts of the electric wire lead-in part structure 15 are not necessarily limited to those in the drawings and can be changed within the scope of claims.

REFERENCE SIGNS LIST

1 Electric compressor
2 Housing
2C Inverter accommodating chamber
2Ca Wall part of inverter accommodating chamber
11 Power supply cable (shield electric wire)
15 Electric wire lead-in part structure
16 Conductor insertion hole
17 Conductor member
18 Covering member
18A Inner end surface of covering member
23 Electric wire passing hole
28 Sealing member engagement recess
29 Bolt insertion hole (joint part)
31 Bolt hole (joint part)
35 Screw member (joint part)
36 Female screw (joint part)
37 Sealing member
40 Electric wire waterproofing part
45 Shield part
50 Shield grounding part
52 Set screw
55 Crimp ring

The invention claimed is:

1. An electric wire lead-in part structure of an electric compressor which is configured to lead a shield electric wire such as a power supply cable into an inverter accommodating chamber of the electric compressor, comprising:
a conductor insertion hole formed through a wall part of the inverter accommodating chamber;
a conductor member made of an electrically conductive material and inserted into the conductor insertion hole in a waterproof manner and also, electrically conducted to the conductor insertion hole and holding the shield electric wire passed therethrough;
a shield grounding part for electrically conducting a shield part of the shield electric wire to the conductor member at a position where the conductor member is provided; and
an electric wire waterproofing part for waterproofing a gap between the conductor member and the shield electric wire.

2. The electric wire lead-in part structure of an electric compressor according to claim 1, wherein the shield grounding part is configured to fasten a set screw abutted against the shield part, the set screw being threadedly engaged with the conductor member so as to protrude into an electric wire passing hole formed in the conductor member, across an axial direction of the electric wire passing hole.

3. The electric wire lead-in part structure of an electric compressor according to claim 2, wherein a crimp ring that is electrically conducted to the shield part, is fit around the shield electric wire at midpoint thereof, and the set screw is brought into abutment with the shield part via the crimp ring.

4. The electric wire lead-in part structure of an electric compressor according to claim 1, further comprising:
a covering member configured to cover the conductor insertion hole and outside of the conductor member; and
a joint part configured to fasten the conductor member and the covering member together to the wall part,
wherein the electric wire waterproofing part comprises:
an inner end surface of the covering member;
a cylindrical hole-like sealing member engagement recess formed in the conductor member adjoining outside in an axial direction of the electric wire passing hole, and closed by the inner end surface of the covering member; and
a sealing member that is formed of an elastic material into a short cylindrical shape, that has a larger size in thickness than an axial depth of the sealing member engagement recess, that is fit into the sealing member engagement recess, and that allows the shield electric wire to pass therethrough.

5. A shield electric wire comprising the electric wire lead-in part structure of an electric compressor according to claim 1.

6. An electric compressor comprising the electric wire lead-in part structure according to claim 1.

* * * * *